United States Patent
Ramamurthy et al.

[11] Patent Number: 6,032,279
[45] Date of Patent: Feb. 29, 2000

[54] BOUNDARY SCAN SYSTEM WITH ADDRESS DEPENDENT INSTRUCTIONS

[75] Inventors: Srinivas Ramamurthy; Jinglun Tam, both of San Jose; Geoffrey S. Gongwer, Campbell, all of Calif.; James Fahey, Aix En Provence, France

[73] Assignee: Atmel Corporation, San Jose, Calif.

[21] Appl. No.: 08/965,919

[22] Filed: Nov. 7, 1997

[51] Int. Cl.[7] .................................................. G01R 31/28
[52] U.S. Cl. .......................................... 714/727; 714/730
[58] Field of Search ............................. 371/22.32, 22.31, 371/22.35; 714/724, 726, 727, 730

[56] References Cited

U.S. PATENT DOCUMENTS

| | | | |
|---|---|---|---|
| 5,155,732 | 10/1992 | Jarawala et al. | 371/22.3 |
| 5,355,369 | 10/1994 | Greenbergerl et al. | 371/22.3 |
| 5,394,403 | 2/1995 | Klein | 371/21.1 |
| 5,459,737 | 10/1995 | Andrews | 371/22.5 |
| 5,477,545 | 12/1995 | Huang | 371/22.3 |
| 5,898,704 | 4/1999 | Kawano | 371/22.32 |

Primary Examiner—Emmanuel L. Moise
Assistant Examiner—Esaw Abraham
Attorney, Agent, or Firm—Thomas Schneck; John P. McGuire, Jr.

[57] ABSTRACT

Boundary Scan integrated circuits are provided with a plurality of new registers between two dedicated pins, Test Data In (TDI) and Test Data Out (TDO) pins. The new registers include an address register and a plurality of test data registers which are addressable by the address register using address-dependent instructions in the instruction register (IR). Instructions for the addressable registers may be steered to the correct register with an ADDLOAD instruction placed in the instruction register followed by an address-dependent instruction. The ADDLOAD instruction makes the address register active between the TDI and TDO pins. Any instruction from a set of address-dependent instructions may be steered to any register handling address-dependent instructions allowing a small number of instructions to be used in a large number of addressable data registers. At the same time non-addressable registers, such as the Boundary Scan register, use address-independent instructions.

6 Claims, 3 Drawing Sheets

BOUNDARY SCAN SYSTEM WITH ADDRESS DEPENDENT INSTRUCTIONS

TECHNICAL FIELD

The invention relates to integrated circuit testing and, in particular, to integrated circuit testing by a Boundary Scan system.

BACKGROUND ART

IEEE/ANSI standard 1149.1 —1990, also known as JTAG and Boundary Scan, is a standard for testing integrated circuits as well as circuit boards. In the prior art, printed circuit boards were tested by automatic test equipment (ATE) which contacted special locations on a board by means of probe wires attached to a probe card. The probe card interfaced with the ATE in a manner such that test signals could be sent to and from the ATE to specific areas of a board under test. On the other hand, Boundary Scan requires that certain registers and dedicated pins be placed on a chip so that software can be used to implement test procedures, rather than ATE. Relatively inexpensive computers can now be used to test integrated circuit chips even after the chip is manufactured and shipped. Five dedicated pins provided on chips with a Boundary Scan test capability communicate with a Test Access Port (TAP) which gives access to logic which executes Boundary Scan and other test procedures. The pins are Test Data In (TDI), Test Data Out (TDO), Test Clock (TCK), Test Mode Select (TMS) and Test Reset (TRST).

Three of the five dedicated pins, namely TMS, TCK and TRST, access a simple state machine, with 16 states, known as the TAP Controller. In turn, the TAP Controller, together with dedicated pins TDI and TDO communicate with an Instruction Register, as well as with two other registers which are mandatory in any Boundary Scan implementation. These are the Boundary Scan Register and the Bypass Register. The Instruction Register, in turn, communicates with other registers, known generally as Data Registers, some of which may be user-defined. The Data Registers allow for device configuration, verification, test, reliability evaluation and so on. One further important feature of Boundary Scan architecture is a set of test cells, one cell being associated with each of the functional input/output pins of the integrated circuit so that a cell may be used as an input or output cell for the device. The cells are arranged in a shift-register organization for serial communication between the TDI and TDO pins.

In the book "The Boundary-Scan Handbook" by K. P. Parker, the author states on p. 46 "User-defined instructions may target standard registers (such as the Boundary Register), portions of standard registers, or concatenations of registers between TDI and TDO. Alternatively, new user-defined registers may be targeted". An object of the invention was to devise user-defined registers which expand the usefulness of Boundary Scan testing and to make the User-defined registers readily accessible to software.

SUMMARY OF INVENTION

The above object has been met with a Boundary Scan system which makes an increased number of data registers addressable with a relatively small number of instructions. This is accomplished with a new address register which is accessed with an additional instruction beyond the standard instructions in the Boundary Scan instruction set. The new instruction, ADDLOAD, when present in the instruction register, allows inspection or loading of the newly provided address register. When the ADDLOAD instruction is in the instruction register, the address register may be inspected or loaded using the standard CAPTURE-DR, SHIFT-DR, UPDATE-DR sequence. At the same time the instruction register is not affected and is always enabled by the TAP controller CAPTURE-IR, SHIFT-IR, UPDATE-IR sequence in the usual way.

Like data registers, the new address register is connected between TDI (test data in) and TDO (test data out) pins, with the output connected to a multiplexer. The contents of the address register indicate which data register is to be accessed for each instruction. Other instructions can be made address-independent so that selected data registers can be individually accessed by software. The Boundary Scan instruction set now contains two types of instructions. A first type includes address-dependent instructions directed to selected test data registers, depending on the state of the address register, while a second type includes address-independent instructions directed to specific registers.

One of the advantages of the invention is that any instruction TESTDATA1 through TESTDATAn−1 may access any of the test data registers 1 through (n−1) depending upon the contents of the address register. For large n, this can greatly reduce the number of instructions required. The address register provides hierarchical steering of instructions for test data registers.

BEST MODE FOR CARRYING OUT THE INVENTION

Figure 1:
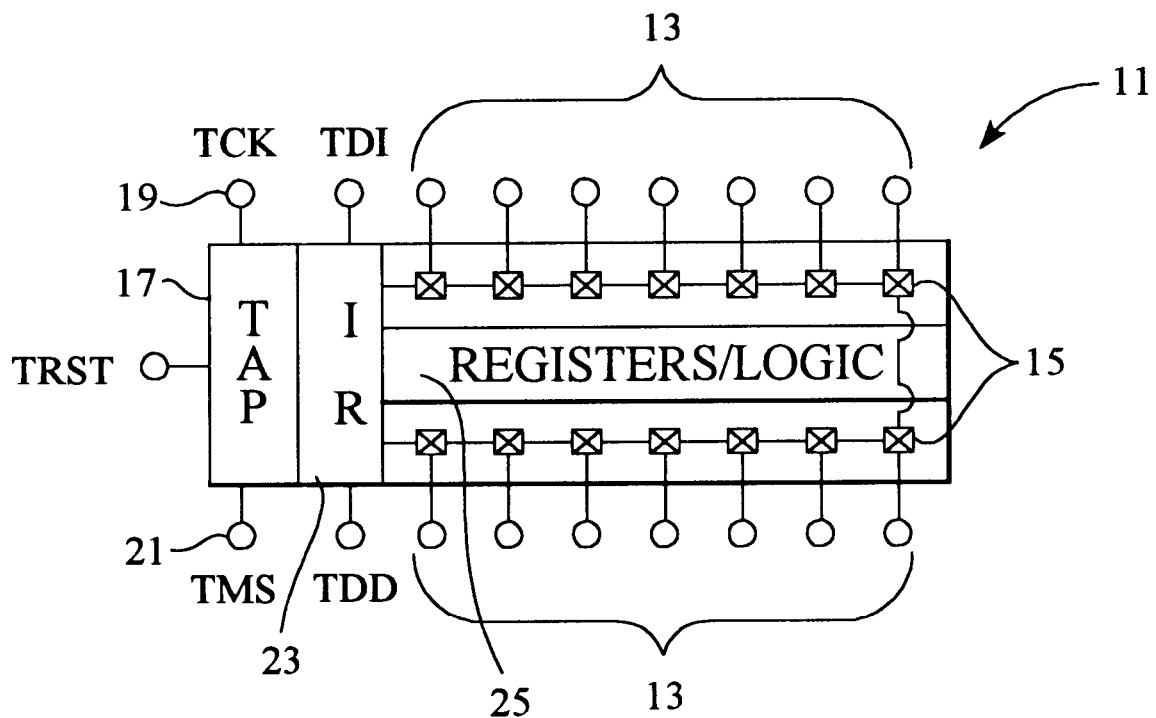
FIG. 1 is a plan view of an integrated circuit chip employing Boundary Scan test circuits, according to the prior art Boundary Scan standard, for testing the chip.

With reference to FIG. 1, an integrated circuit chip 11 is seen to have a plurality of functional pins 13 extending from both sides of the chip. These pins are used to execute all functions of the chip, including providing utility functions such as power supply functions and ground. Inward of the pins are boundary register cells 15 indicated by square rectangular blocks filled with the letter x. These cells can serve either as input or output boundary register cells. Each cell is a single shift register stage connected to an adjacent cell. In this manner, each cell is linked to other cells forming a boundary-scan register, shown in FIG. 3. When the boundary scan register is selected as a serial path between the TDI and TDO pins, boundary cell inputs and outputs, i.e., chip inputs and outputs, may be observed.

Returning to FIG. 1 a test access port (TAP) controller 17 is the heart of a boundary scan system. The TAP controller includes a state machine which is clocked at the TCK pin 19. IEEE Standard 1149.1 indicates that there shall be 16 states in the state machine of the TAP controller which operate as shown in the flow diagram of FIG. 2. Each state is shown in a block with a 0 or 1 indicating the signal on TMS pin 21 of TAP controller 17. TMS is an acronym for test mode select.

Figure 2:
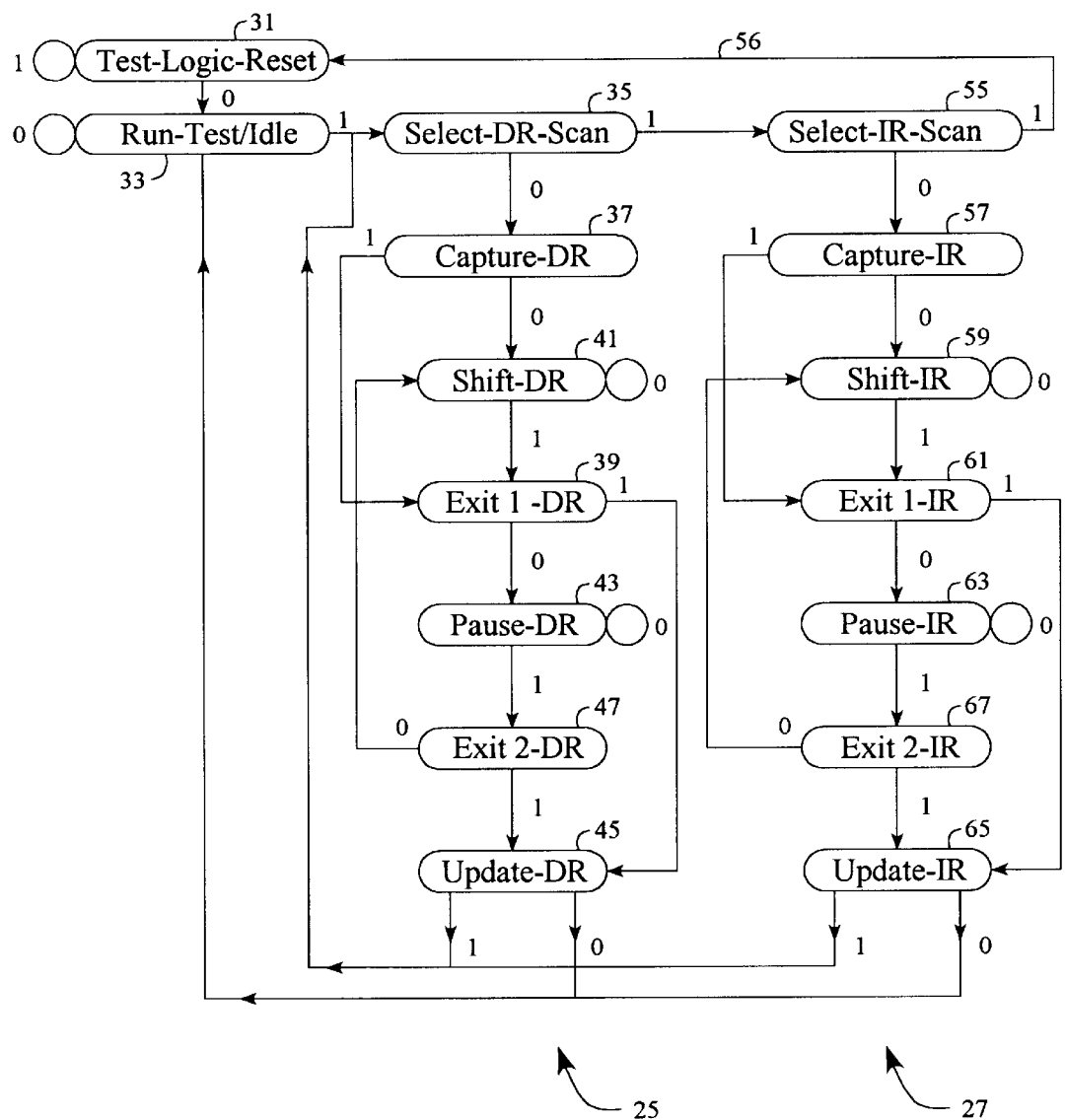
FIG. 2 is a TAP controller state diagram for prior art instruction sequencing of the present invention.

In FIG. 2, the column of blocks 25 is a data column, while the column of blocks 27 is an instruction column. The data column refers to a sequence of steps for data registers, labeled DR while the instruction column labels refer to a sequence of steps for an instruction register IR. Returning to FIG. 1, the instruction register 23 is shown to be immediately connected to the TAP controller 17, while the data registers 25 are seen to be removed from the TAP controller. The instruction register IR and the data registers DR will be more fully discussed with reference to FIG. 3.

Returning to FIG. 2, the upper lefthand block 31 is an initialization state which receives an input from TMS pin 21 in FIG. 1. In one mode, all test logic in registers 25 of FIG. 1 is disabled. In another mode RUN-TEST/IDLE block 33 is enabled. When triggered by the TMS pin, the controller steps to the SELECT-DR-SCAN state, indicated by the block 35. Block 35 triggers entry into the data column 25 or alternatively to the instruction column 27. On entry into the data column, the controller implements the CAPTURE-DR state, indicated by block 37, being a sequence for test data registers. With an alternative select signal, the SELECT-DR-SCAN block 35 can trigger action by instruction column 37 where there is a SELECT-IR-SCAN block 55 which moves into the CAPTURE-IR state block 57 where there can be a scan sequence for the instruction register. On the other hand, with another TMS signal, the controller can loop back to the TEST-LOGIC-RESET state indicated by block 31 by means of a signal transmitted along line 56. The CAPTURE-IR state requires that the instruction register 23 of FIG. 1 load a pattern of logic values for test purposes. Exit from the CAPTURE-IR block 57 is either to SHIFT-IR block 59 or to EXIT1-IR block 61 where there is a further branching to PAUSE-IR block 63 or, in another mode, to UPDATE-IR block 65. On the other hand, the PAUSE-IR block 63 can lead to EXIT2-IR block 67 which will loop back or proceed to UPDATE-IR block 65.

Returning to FIG. 2, the CAPTURE-DR block 37 loads a test data register selected by the current instruction in the instruction register. This leads either to EXIT1-DR block 39 or directly to SHIFT-DR block 41 where looping for a preset number of cycles may occur. The EXIT1-DR block 39 leads either to PAUSE-DR block 43 where looping for a predetermined number of clock cycles may occur or to UPDATE-DR block 45. When cycling through the PAUSE-DR state 43 is complete, the EXIT2-DR state 47 is entered, terminating the pause condition. From the EXIT2-DR state 47 the controller enters the UPDATE-DR state 45 or the SHIFT-DR state 41. The UPDATE-DR block allows data to be latched at the outputs of test data registers. The UPDATE-DR register provides a latched parallel output of the test data registers which normally shift data serially. The exit from this state is back to the RUN-TEST/IDLE state 35 or the SELECT-DR-SCAN state 35. The present invention works within the framework of the state transitions shown in FIG. 2.

Figure 3:
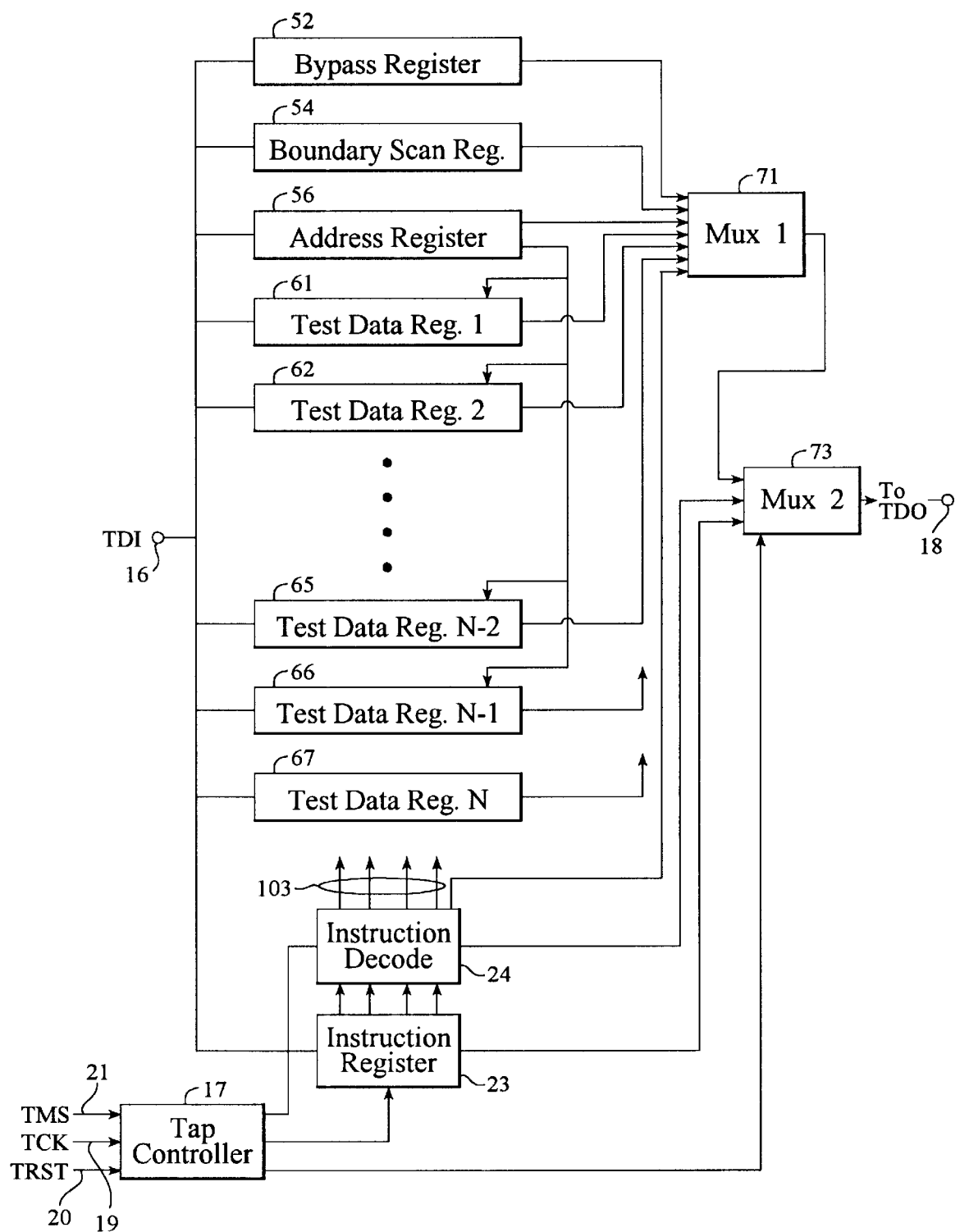
FIG. 3 is a block diagram of the test access port (TAP) and register configuration of a Boundary Scan System in accord with the present invention.

With reference to FIG. 3, TAP controller 17 is shown to have dedicated input pins including the mode select TMS pin 21, the test clock pin 19 and the reset pin 20. The TAP controller 17 communicates with instruction register 23 executing the states discussed with reference to FIG. 2. The instruction register 23 communicates with instruction decoder 24 which provides mode selection outputs on lines 103 communicated to the various registers. Note that instruction register 23 resides between the test data input pin (TDI) 16 and the test data output pin (TDO) 18. A number of other registers are arranged in parallel between the TDI pin 16 and the TDO pin 18. These include the bypass register 52 and the boundary scan register 54. It will be remembered that the boundary scan register contains the boundary scan cells 15 shown in FIG. 1.

One of the salient features of the present invention is the provision of address register 56 which like the other registers previously discussed, as well as the test data registers discussed below, exist between TDI pin 16 and TDO pin 18. The address register is accessed by executing an ADDLOAD instruction. When this instruction is in the instruction register, the address register is active between the TDI and TDO pins. The address register may then be inspected or loaded using the CAPTURE-DR, SHIFT-DR, UPDATE-DR sequence discussed with reference to FIG. 2.

Also connected between the TDI input pin 16 and the TDO output pin 18 is a plurality of data registers, including test data register 61; test data register 2, 62 . . . ; test data register N–2, 65; test data register N–1, 66; and test data register N, 67.

The content of address register 56 determines which register is to be accessed by particular instructions. The address register must have a size sufficient to be able to point to all related data registers. Usually this will not be more than six or eight bits. Table 1 below shows one possible instruction set to be used with the present invention, indicating which register is accessed for each instruction.

TABLE 1

Instruction set using address-decoded register access

| Instruction Name | Register | Address | Instruction Code |
|---|---|---|---|
| Sample/Preload | Boundary Scan | Not Used | 00101010 |
| Extest | Boundary Scan | Not Used | 00000000 |
| Bypass | Bypass | Not Used | 11111111 |
| TESTDATA1 | TDR(1 to n-1) | 1 to n-1 | 10000000 |
| TESTDATA2 | TDR(1 to n-1) | 1 to n-1 | 10010000 |
| . | . | . | . |
| . | . | . | . |
| . | . | . | . |
| TESTDATAn-1 | TDR(1 to n-1) | 1 to n-1 | 11100000 |
| TESTDATAn | TDRn only | Not Used | 11110000 |

Table 1 indicates that certain instructions are addressed as dependent with regard to selection of a particular register. Note that any one of the instructions TESTDATA 1 through TESTDATAN–1 may flow to any of the test data registers 1 through N–1, i.e. registers 61, 62, . . . , 65 or 66. For a large number of registers, this greatly reduces the number of instructions required because any one of the instructions, for example, TESTDATA 1, may be steered to any of the addressable data registers by means of the contents of address register 56. Thus, the increased hardware overhead by providing address register 56 is compensated by hierarchical steering of instructions to any of the data registers.

Table 1 shows that not all test data registers can use address selection. In this example, test data register N, i.e. register 67, does not use address selection and is accessed only by the TESTDATA N instruction. In accord with the present invention, there may be a mix of address dependent and address-independent test data registers. It should be noted that instruction register 23 is not affected by address register 56. Access to instruction register 23 is always through TAP controller 17 executing the cycle shown in FIG. 2.

TABLE 2

Expanded instruction set using address-decoded register access

| Instruction Name | Register | Address | Instruction Code |
|---|---|---|---|
| Sample/Preload | Boundary Scan | Not Used | 00101010 |
| Extest | Boundary Scan | Not Used | 00000000 |
| Bypass | Bypass | Not Used | 11111111 |
| TESTDATA1 1 | TDR1 | 1 | 10000001 |
| TESTDATA1 2 | TDR2 | 2 | 10000010 |
| . | . | . | . |
| . | . | . | . |
| . | . | . | . |
| TESTDATA1-n | TDRn | n | 10001110 |
| TESTDATA2 1 | TDR1 | 1 | 10010001 |
| TESTDATA2 2 | TDR2 | 2 | 10010010 |
| . | . | . | . |
| . | . | . | . |
| . | . | . | . |
| TESTDATA2 n | TDRn | n | 10011110 |
| TESTDATAn-1 1 | TDR1 | 1 | 11100001 |
| TESTDATAn-1 2 | TDR2 | 2 | 11100010 |
| . | . | . | . |
| . | . | . | . |
| . | . | . | . |
| TESTDATAn-1 n | TDRn | n | 11101111 |
| TESTDATAn | TDRn | Not Used | 11110000 |

Table 2 shows an expanded instruction set compared to the instruction set of Table 1. In Table 2, each of the instructions TESTDATA 1 through TESTDATA N−1 has been expanded to appear as a set of separate instructions, with the separation indicated at the end of each instruction. For example, the instruction TESTDATA 1_2 executes the TESTDATA 1 instruction specifically in data register 2, i.e. register 62. Such an instruction expansion is possible with no change in instruction configuration relative to Table 1 if there are sufficient don't care bit conditions within the available instruction codes. In the example of Table 1, the rightmost bits of the instruction code are don't care bits during test data instruction execution. The expanded test data instruction now accesses a single register while the actual design maintains a minimum number of instructions in a relatively simple instruction decoder. While each test data instruction may access a single register, the address register may be used to steer any instruction to any register.

TABLE 3

Flow Diagram for Test Data Register Access

1) Test-Logic-Reset
2) Run-Test-Idle
3) Select-DR-Scan
4) Select-IR-Scan
5) Capture-IR
6) Shift-IR; repeat for N cycles, N = IR Length
   (Instruction = AddLoad)
7) Exit1-IR
8) Update-IR
9) Select-DR-Scan
10) Capture-DR
11) Shift-DR; repeat for M cycles, M = address register Length
    (Data = Target TDR's address)
12) Exit1-DR
13) Update-DR
14) Select-DR-Scan
15) Select-IR-Scan
16) Capture-IR
17) Shift-IR; repeat for N cycles, N = IR Length
    (Instruction = Any address-specific instruction)
18) Exit1-IR
19) Update-IR
20) Select-DR-Scan TABLE 3-continued Flow Diagram for Test Data Register Access 21) Capture-DR
22) Shift-Dr; repeat for K cycles, K = TDR Length
    (Data = TDR data)
23) Exit1-DR
24) Update-DR The full process for accessing address dependent registers is shown in Table 3. First, the ADDLOAD instruction is loaded into instruction register 23. Next, the address register is filled with the target data register address. Then the desired address specific instruction is loaded into the instruction register 23. Finally, the target data register itself is loaded. As new data is shifted in, at state SHIFT-DR, step 22, all data is simultaneously shifted out on the TDO pin, for inspection. At this point, the target data register has been updated with new data and further operations may be performed using these new data.

Outputs from the data registers pass through a first multiplexer 71 to a second multiplexer 73 which is enabled through the TAP controller 17 to the TDO output pin 18. Thus, the TAP controller controls both the loading and scanning of instructions from the TDI pin 16 to the scanning and updating of registers by shifting data out to the TDO output pin 18. The address register 56 steers desired address dependent instructions to the various test data registers, allowing a rich selection of user-defined instructions to be steered to desired registers.

The various test data registers may be used in connection with the user-defined TAP test data instructions for many various functions, including built-in self-tests or scan-testing of an integrated circuit chip by comparison of the various inputs and outputs with signals placed on the TDI and TDO pins.

We claim:

1. A Boundary Scan test apparatus for integrated circuits comprising, a plurality of Boundary Scan cells connected to functional pins of an integrated circuit chip, a test access port controller connected to dedicated Boundary Scan pins including TMS and TCK pins, an instruction register communicating with the test access port controller and connected to dedicated Boundary Scan pins including TDI and TDO pins, a boundary register, a bypass register, a plurality of test data registers and an address register all connected in parallel between the TDI and TDO pins, all of said registers communicating with the instruction register, said address register being loaded with an address that points to a specific one of the test registers, a software instruction set adapted for decoding by the instruction register, said instruction set having first instructions dependent on an address of a target test data register and second instructions which are independent of addresses and directed to specific registers not among the addressable test data registers, said first instructions including an additional instruction for the instruction register wherein the additional instruction augments a standard instruction set and accesses the address register, and wherein one of the test registers is selected to be accessed, the selected test register being determined by the address loaded in the address register when the additional instruction is executed.

2. The apparatus of claim 1 wherein at least one test data register, but not all test data registers, is independent of an address.

3. The apparatus of claim 1 further comprising a plurality of address dependent instructions available for each test data register wherein the selected test register receives one of the address dependent instructions.

4. A Boundary Scan test apparatus for integrated circuits of the type having a test access port (TAP) controller with a standard instruction set, an instruction register (IR), a boundary register, a bypass register, a plurality of dedicated Boundary Scan pins including a test data in (TDI), a test data out (TDO) pins, a plurality of circuit input and output pins with associated boundary register cells, the improvement comprising, a plurality of test data registers connected in parallel between TDI and TDO pins and having a size sufficient to hold test data words, an address register connected in parallel with the test data registers and being loaded with an address that points to a specific test data register, an additional instruction for the instruction register wherein said additional instruction augments the standard instruction set and accesses the address register, and wherein one of the test registers is selected to be accessed, the selected test register being determined by the address loaded in the address register when the additional instruction is executed.

5. The apparatus of claim 4 wherein the standard instruction set is augmented with address-dependent instructions.

6. The apparatus of claim 4 wherein the standard instruction set is augmented with address-dependent instructions for the test data registers and at least one address-specific instruction for one of the test data registers.

* * * * *